United States Patent
Hu et al.

(10) Patent No.: US 10,039,192 B1
(45) Date of Patent: Jul. 31, 2018

(54) ULTRA-THIN DUAL-CHANNEL FLEXIBLE CIRCUIT BRIDGE CONNECTOR

(71) Applicant: WIESON TECHNOLOGIES CO., LTD., New Taipei (TW)

(72) Inventors: Qiang-Long Hu, New Taipei (TW); Wen-Sheng Liu, New Taipei (TW)

(73) Assignee: WIESON TECHNOLOGIES CO., LTD., New Taipei (TW)

( * ) Notice: Subject to any disclaimer, the term of this patent is extended or adjusted under 35 U.S.C. 154(b) by 0 days.

(21) Appl. No.: 15/703,174

(22) Filed: Sep. 13, 2017

(51) Int. Cl.
| | |
|---|---|
| H05K 1/00 | (2006.01) |
| H05K 1/18 | (2006.01) |
| H05K 3/36 | (2006.01) |
| H01R 12/59 | (2011.01) |
| H05K 1/14 | (2006.01) |
| H05K 3/34 | (2006.01) |
| H01R 12/77 | (2011.01) |

(52) U.S. Cl.
CPC ........... *H05K 1/189* (2013.01); *H01R 12/59* (2013.01); *H05K 1/148* (2013.01); *H05K 3/363* (2013.01); *H01R 12/778* (2013.01); *H05K 3/3457* (2013.01); *H05K 2201/2009* (2013.01)

(58) Field of Classification Search
CPC ........ H05K 1/189; H05K 1/148; H05K 3/363; H05K 3/3457; H01R 12/59; H01R 12/778

USPC ... 361/679.01, 728, 736, 737, 748–751, 760
See application file for complete search history.

(56) References Cited

U.S. PATENT DOCUMENTS

| 5,785,550 A | * | 7/1998 | Leshem | ............. H01R 13/6471 439/497 |
| 2010/0302754 A1 | * | 12/2010 | Nordin | ................. G02B 6/4452 361/810 |

* cited by examiner

*Primary Examiner* — Tremesha S Willis
(74) *Attorney, Agent, or Firm* — Muncy, Geissler, Olds & Lowe, P.C.

(57) ABSTRACT

The present disclosure illustrates an ultra-thin dual-channel flexible circuit bridge connector including a dual-channel flexible circuit board, a first connection interface and a second connection interface. The dual-channel flexible circuit board includes, in a sequential order, a first insulating layer, a first circuit layer, a second insulating layer, a ground layer, a third insulating layer, a second circuit layer and a fourth insulating layer. The first connection interface and the second connection interface can be used to link two extend interface cards spaced apart by various distances, thereby forming a bridge status. The ground layer between the first circuit layer and the second circuit layer can be served as a common reference plane for dual-channel high frequency signal transmission and provide shielding and isolating effect, so as to satisfy the requirement for working bandwidth to satisfy the requirement for characteristic impedance, reduce skin effect, reduce EMI and crosstalk interference.

10 Claims, 8 Drawing Sheets

ULTRA-THIN DUAL-CHANNEL FLEXIBLE CIRCUIT BRIDGE CONNECTOR

BACKGROUND OF THE INVENTION

1. Field of the Invention

The present disclosure relates to an ultra-thin dual-channel flexible circuit bridge connector, more particularly to an ultra-thin dual-channel flexible circuit bridge connector using a dual-channel flexible circuit board to link two extend interface cards spaced apart by various distances, so as to form a bridge status. Furthermore, the ultra-thin dual-channel flexible circuit bridge connector of the present disclosure can meet the requirement in characteristic impedance during high frequency signal transmission and reduce electromagnetic wave interference (EMI), thereby achieving stable dual-channel high frequency signal transmission and higher transmission efficiency.

2. Description of the Related Art

With rapid development in the electronic technology, a computer or a server has higher and higher computing speed and efficiency. The computer or the server includes a motherboard, and a central processor and a memory disposed on the motherboard to serve as information processing center; and, the computer or the server is also connected with peripheral devices (such as a screen or a modem) for display, data transmission and command control. Therefore, there are various interface cards inserted in sockets on the motherboard, so that the peripheral devices can perform data transmission with the computer or the server through the interface cards, and the computer or the server can be linked with more peripheral devices for function expansion.

Furthermore, with consumers' constant pursuit of high image quality, the display interface is required to define higher and higher resolution and efficiency. For this reason, manufacturers develop Scalable Link Interface (SLI) technology for bridging two graphics cards for single output in use. A motherboard supportable to the SLI technology is provided with two sockets disposed in parallel, and the two graphics cards are respectively inserted into the two sockets. Each graphics card includes a connector disposed on a top thereof, and a plurality of connecting members of a dual-graphics card bridge connector are respectively connected to the connectors of the two graphics cards to form a bridge status, so that the motherboard can manipulate the graphics processing units on the two graphics cards to perform parallel computation for 3D graphics, thereby achieving the best graphic display efficiency. With progress of integrated circuit technology, the hardware architecture of two graphics cards is declining gradually; however, when virtual reality and augmented reality technologies become more popular, the technology of bridging two graphics cards is taken seriously again. This technology is mainly applied in the interface card with in PCI-Express standard, which is a mainstream standard currently in computer field, to solve problems that the bus transmission architecture of conventional expansion interface is inadequate and has not enough bandwidth. By using the SLI technology, two graphics cards can sufficiently achieve high-speed graphic display performance.

Commercially available bridge connectors for dual graphics cards can be classified into single-channel flexible bridge connector, single-channel board bridge connector, and dual-channel board bridge connector. The conventional single-channel flexible bridge connector uses a flexible board which includes an insulating layer, and two signal layers which are respectively disposed on upper and lower sides of the insulating layer. Because of limitation in flexible substrate and circuit layout used in manufacturing process of flexible board and physical limitation in structure, the dual-layer flexible board is unable to meet the requirement in high transmission rate and high efficiency. Furthermore, during the high-speed transmission, high frequency signal reflection and skin effect are occurred easily, and the multilayer flexible board structure can use a power layer and a ground layer, which both are disposed at middle section of the flexible board, so as to improve electrical characteristics (such as characteristic impedance). However, with increasing of the high frequency signal transmission channel and working bandwidth of the multilayer flexible board, the multilayer flexible board may have higher thickness and insufficient flexibility, and not easily meet the requirement in characteristic impedance, and this is the reason that the conventional single-channel flexible bridge connector is mainly provided with two-layer flexible board for low data rate application, and is unable to support signal transmission between high-end graphics cards bridged with each other.

In recent years, circuit board manufacturing process technology is fully developed to manufacture a circuit board with high performance, high density and multilayer interconnection structure, and this circuit board can be applied in the single-channel board bridge connector or dual-channel board bridge connector; besides, in order to meet the requirement for high frequency signal transmission and electrical characteristics and reduce skin effect and EMI between adjacent circuit layers, more power layers and ground layers must be added into the circuit board. The number of layers of the circuit board indicates the number of individual circuit layers and is usually an even-number, for example, the circuit board usually has two layers, four layers or eight layers; however, the circuit board having more layers usually has higher thickness and poor flexibility, so the circuit board cannot be bent easily. Various motherboard manufacturers or graphics card manufacturers usually have different design solutions, and it indicates that a bridging distance between two graphics cards cannot be standardized, so it is hard for one conventional dual-channel board bridge connector to bridge two graphics cards spaced apart by various distances, that is, the conventional dual-channel board bridge connector cannot meet the user's requirement in upgrade and expansion.

SUMMARY OF THE INVENTION

An objective of the present disclosure is to provide an ultra-thin dual-channel flexible circuit bridge connector using a dual-channel flexible circuit board. The dual-channel flexible circuit board includes, in a sequential order, a first insulating layer, a first circuit layer, a second insulating layer, a ground layer, a third insulating layer, a second circuit layer and a fourth insulating layer, and the dual-channel flexible circuit board has a total thickness in a range of 0.2 mm to 0.6 mm for better compactness, and has higher folding resistance. A first connection interface and a second connection interface are electrically connected to two sides of the first circuit layer, the ground layer and the second circuit layer, so that the first connection interface and the second connection interface can be used to link two extend interface cards spaced apart by various distances, thereby forming a bridge status. The ground layer between the first circuit layer and the second circuit layer can be served as a common reference plane for dual-channel high frequency signal transmission, so as to satisfy the requirement for working bandwidth to ensure integrity of high frequency signal, and also satisfy the requirement for characteristic impedance, and also reduce skin effect occurred in high frequency signal reflection and transmission. Furthermore, the ground layer can provide shielding and isolating effect, so disposal of the circuit layers close to the common reference plane can reduce EMI and crosstalk interference, thereby achieving stable dual-channel high frequency signal transmission and higher transmission efficiency.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
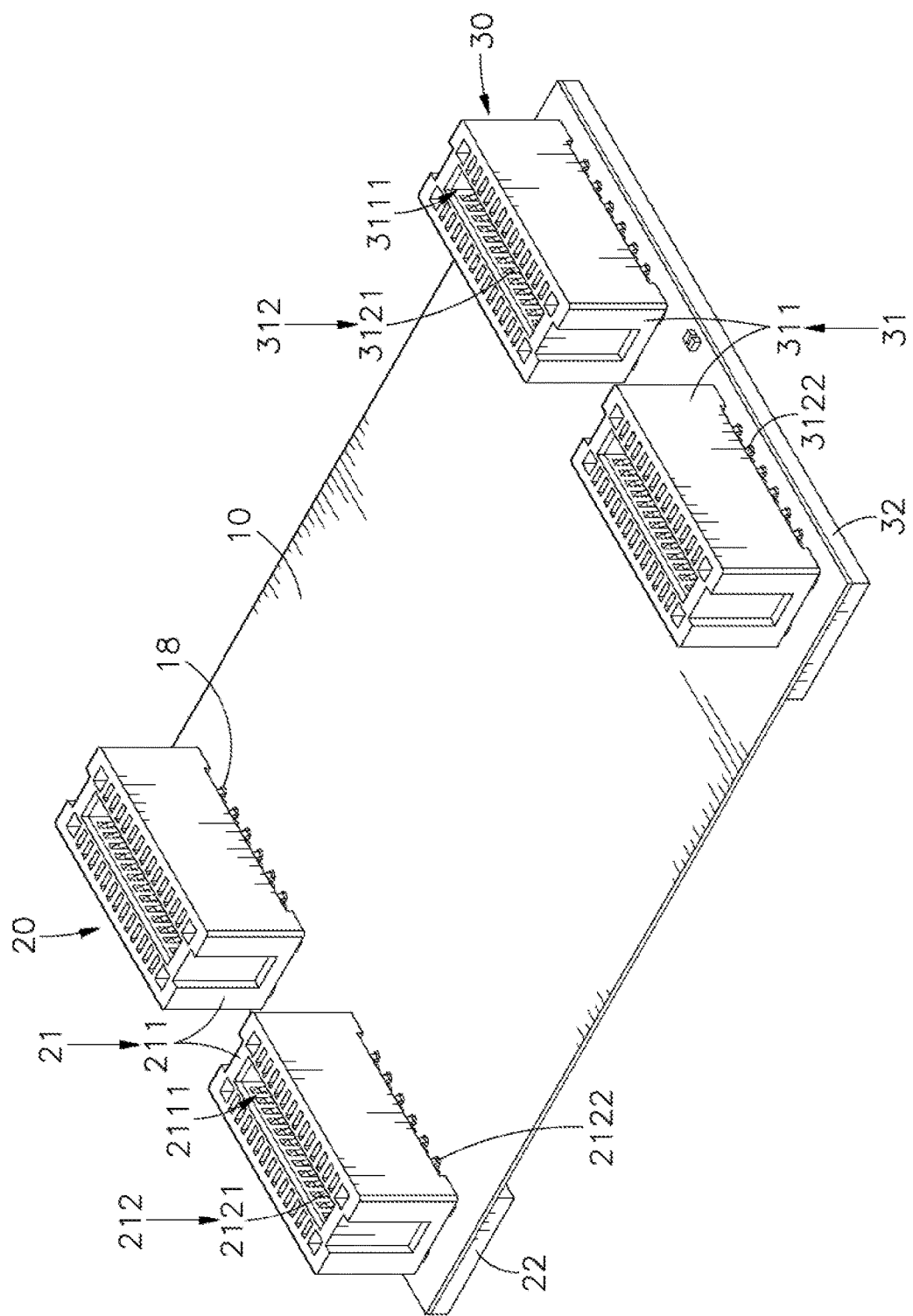
FIG. 1 is an elevational view of an ultra-thin dual-channel flexible circuit bridge connector of the present disclosure.
Figure 2:
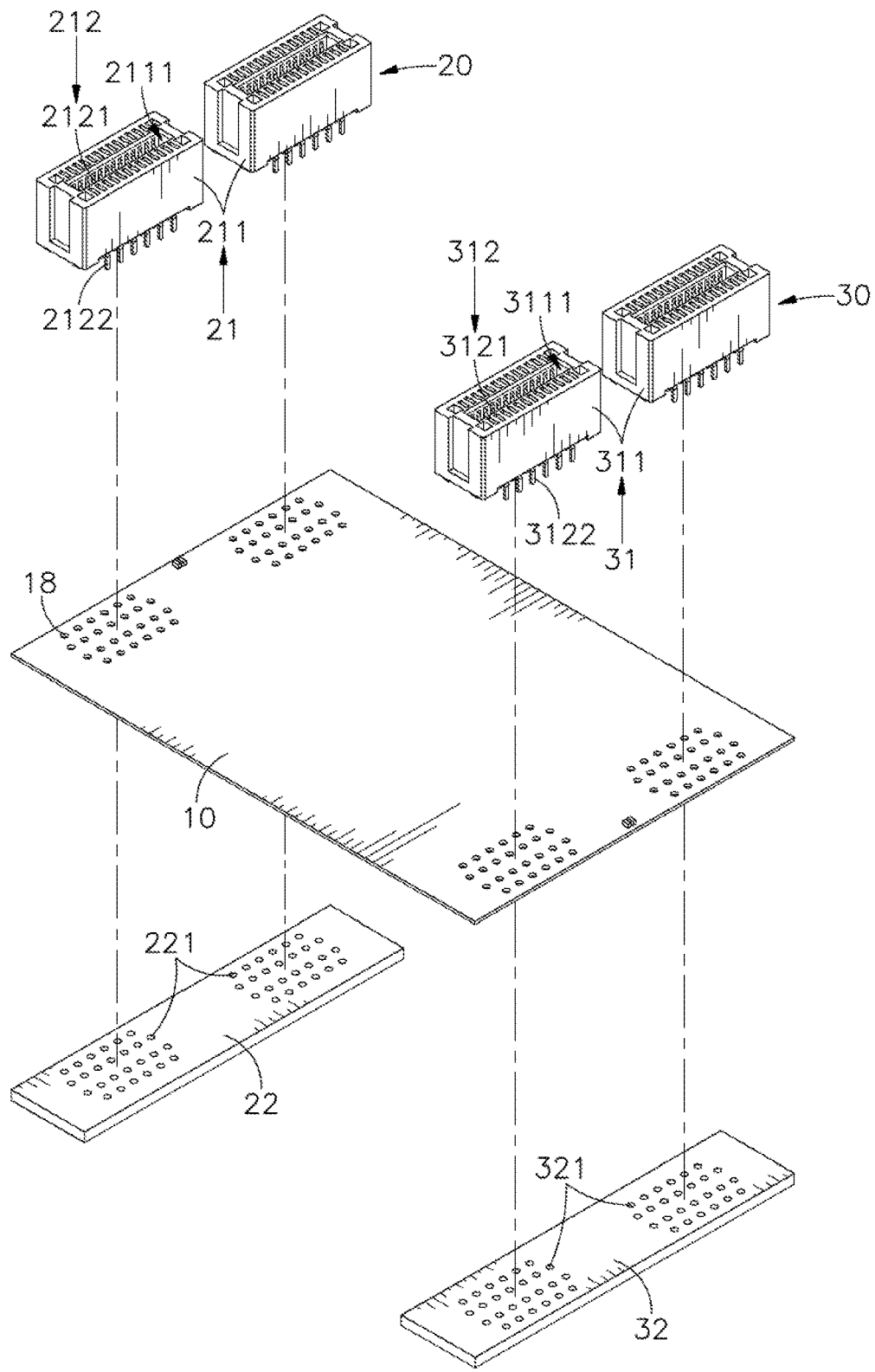
FIG. 2 is an exploded view of the ultra-thin dual-channel flexible circuit bridge connector of the present disclosure.
Figure 3:
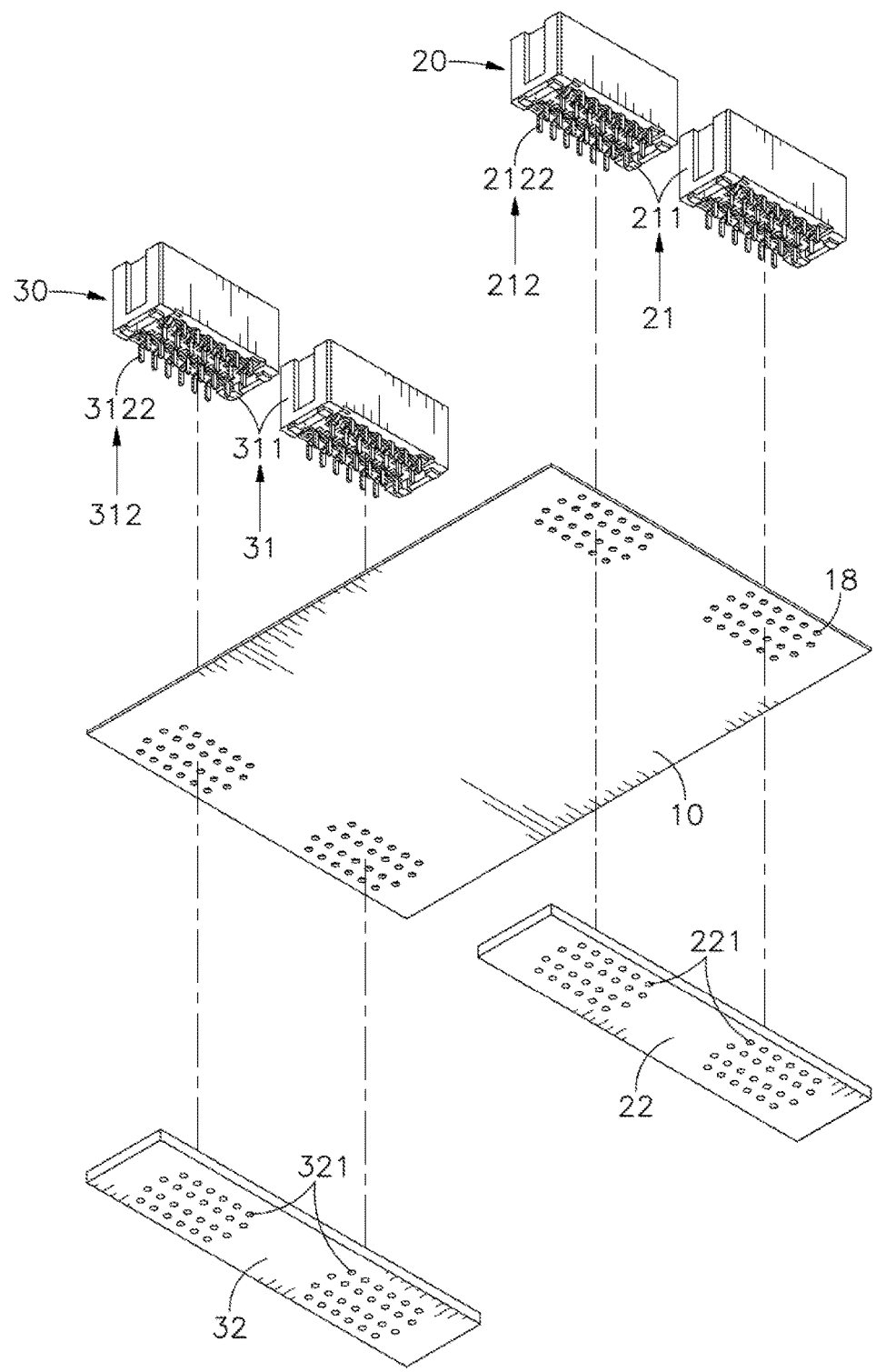
FIG. 3 is an exploded view of the ultra-thin dual-channel flexible circuit bridge connector of the present disclosure, when viewed from another angle.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present invention. As used herein, the term "or" includes any and all combinations of one or more of the associated listed items.

Please refer to FIGS. 1 through 5, which respectively are elevational view, exploded view, and another exploded view of the ultra-thin dual-channel flexible circuit bridge connector of the present disclosure, and a schematic structural view of the dual-channel flexible circuit board, and a schematic structural view of the dual-channel flexible circuit board of a preferred embodiment of the present disclosure. The ultra-thin dual-channel flexible circuit bridge connector of the present disclosure includes a dual-channel flexible circuit board 10, and a first connection interface 20 and a second connection interface 30 which both are disposed at two sides on the same surface of the dual-channel flexible circuit board 10 and electrically connected with each other.

The dual-channel flexible circuit board 10 includes, in a sequential order from bottom to top, a first insulating layer 11, a first circuit layer 12, a second insulating layer 13, a ground layer 14, a third insulating layer 15, a second circuit layer 16 and a fourth insulating layer 17. The first insulating layer 11 includes a first film 111, a first adhesive layer 112 disposed on an upper surface of the first film 111 to form a capping film. The first circuit layer 12 includes a first conductor 121 which is combined on the first film 111 by the first adhesive layer 112. The second insulating layer 13 includes a second film 131, a second adhesive layer 132 which is disposed on a lower surface of the second film 131 to combine the second film 131 and the first conductor 121, and a third adhesive layer 133 disposed on an upper surface of the second film 131. The ground layer 14 is disposed between the first circuit layer 12 and the second circuit layer 16, and includes a metal conductor 141 combined on the second film 131 by the third adhesive layer 133. The third insulating layer 15 includes a third film 151, a fourth adhesive layer 152 disposed on a lower surface of the third film 151 to combine the third film 151 with the metal conductor 141, and a fifth adhesive layer 153 disposed on an upper surface of the third film 151. The second circuit layer 16 includes a second conductor 161 which is combined on the third film 151 by the fifth adhesive layer 153. The fourth insulating layer 17 includes a fourth film 171, and a sixth adhesive layer 172 disposed on a lower surface of the fourth film 171 to form another capping film. The fourth film 171 is combined on the second conductor 161 by the sixth adhesive layer 172 to form a flexible multilayer board.

The first film 111 of the first insulating layer 11, the second film 131 of the second insulating layer 13, the third film 151 of the third insulating layer 15 and the fourth film 171 of the fourth insulating layer 17 may be made of polyimide (PI), polyethylene terephthalate (PET) or other film material with insulative and flexible properties. Preferably, these films are made of polyimide. Each of the first film 111 and the fourth film 171 may have a thickness in a range of 0.5 mil to 1 mil (1 mil is equal to 0.0254 mm), and preferably 25 μm (1 mm is equal to 1000 μm). Each of the second film 131 and the third film 151 may have a thickness in a range of 1 mil to 2 mil, and preferably 50 μm.

The first adhesive layer 112 of the first insulating layer 11, the second adhesive layer 132 and the third adhesive layer 133 of the second insulating layer 13, the fourth adhesive layer 152 and the fifth adhesive layer 153 of the third insulating layer 15, the sixth adhesive layer 172 of the fourth insulating layer 17 may be epoxy resin, polyester resin, acrylic resin, or other thermoset glue. Each of the first adhesive layer 112, the fourth adhesive layer 152 and the sixth adhesive layer 172 may have a thickness in a range of 20 µm to 30 µm, preferably 25 µm; each of the second adhesive layer 132, the third adhesive layer 133 and the fifth adhesive layer 153 may have a thickness in a range of 15 µm to 25 µm, and preferably 20 µm. The first conductor 121 of the first circuit layer 12 and the second conductor 161 of the second circuit layer 16 may be made of rolled copper foil or electrolytic copper foil, and preferably, the first conductor 121 and the second conductor 161 are made of rolled copper foil which has higher folding resistance. The first conductor 121 and the second conductor 161 are performed manufacturing process, such as etching process, to form desired circuits. The ground layer 14 is disposed between the first circuit layer 12 and the second circuit layer 16, and the metal conductor 141 of the ground layer 14 may include copper, aluminum or silver, and preferably copper foil, so as to form a metal foil film or mesh pattern. Each of the first circuit layer 12, the ground layer 14 and the second circuit layer 16 may have a thickness in a range of 30 µm to 40 µm, and preferably 35 µm. The ground layer 14 can be served as a common reference plane or a ground plane (with a reference voltage of 0V) for dual-channel signal transmission on the first circuit layer 12 and the second circuit layer 16.

In this embodiment, besides the first insulating layer 11, the first circuit layer 12, the second insulating layer 13, the ground layer 14, the third insulating layer 15, the second circuit layer 16 and the fourth insulating layer 17, the dual-channel flexible circuit board 10 can include a first flexible substrate 101, a second flexible substrate 102 and a third flexible substrate 103. The first flexible substrate 101 can be a 3-Layer FCCL formed by the first film 111 of the first insulating layer 11, the first adhesive layer 112, and the first conductor 121 of the first circuit layer 12, and the manufacturing process (such as etching process) is performed on the first flexible substrate 101 to form the desired circuits; similarly, the second flexible substrate 102 can be a 3-Layer FCCL formed by the second film 131 of the second insulating layer 13, the third adhesive layer 133, and the metal conductor 141 of the ground layer 14, and the third flexible substrate 103 can be a 3-Layer FCCL formed by the fourth film 171 of the fourth insulating layer 17, the sixth adhesive layer 172, and the second conductor 161 of the second circuit layer 16. A thickness of the dual-channel flexible circuit board 10 or a sum of thicknesses of the first flexible substrate 101, the second flexible substrate 102 and the third flexible substrate 103 can be in a range of 0.2 mm to 0.6 mm. The dual-channel flexible circuit board 10 includes a plurality of thru vias 18 respectively formed on two sides of the dual-channel flexible circuit board 10, and the thru vias 18 at the same side of the dual-channel flexible circuit board 10 are separated into two groups. Each thru via 18 is electrically connected to the first circuit layer 12, the ground layer 14 and the second circuit layer 16, so as to achieve interlayer interconnection in the multilayer structure.

Figure 4:
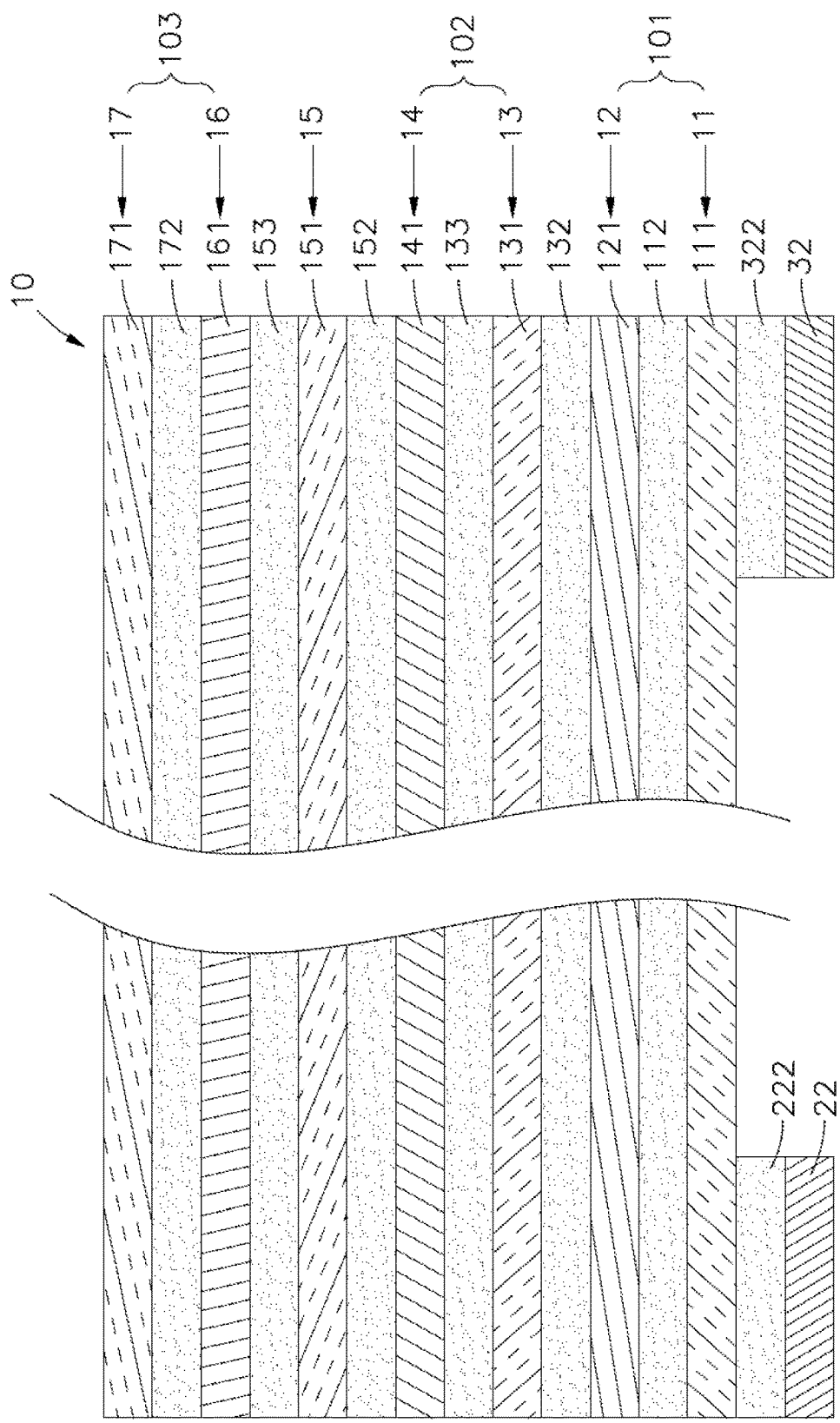
FIG. 4 is a schematic structural view of the dual-channel flexible circuit board of the present disclosure

The first connection interface 20 includes at least two first bridges 21 which each includes a first socket 211, and each first socket 211 includes a first terminal set 212 which includes a plurality of butt joint parts 2121 respectively suspended and inserted into two opposite sidewalls of an insert slot 2111 inside the first socket 211, and each of the butt joint part 2121 includes a solder part 2122 inserted downwardly through a side of the insert slot 2111 opposite to upper opening of the insert slot 2111 and exposed out of a bottom of the first socket 211. The solder parts 2122 exposed out of the bottom of the first socket 211 are in misaligned arrangement. As a result, a board type or dual in-line package (DIP) type of the first bridge 21 is assembled. A first reinforcing plate 22 having a plurality of insertion holes 221 can be disposed under the first socket 211 of the first bridge 21, and the insertion holes 221 respectively correspond in position to the solder parts 2122 under the first terminal set 212. The first reinforcing plate 22 includes an adhesive layer 222 disposed on a side surface thereof (as shown in FIG. 4).

The second connection interface 30 includes at least two second bridges 31 which each includes a second socket 311, and each second bridge 31 includes a second terminal set 312 which includes a plurality of butt joint parts 3121 respectively suspended and inserted into two opposite sidewalls of an insert slot 3111 inside the second socket 311, and each of the butt joint part 3121 includes a solder part 3122 inserted downwardly through a side of the insert slot 3111 opposite to an upper opening of the insert slot 3111 and exposed out of a bottom of the second socket 311. The solder parts 3122 exposed out of the bottom of the second socket 311 are in misaligned arrangement. As a result, a board type or dual in-line package (DIP) type of the second bridge 31 is assembled. A second reinforcing plate 32 having a plurality of insertion holes 321 is disposed under the second socket 311 of the second bridge 31, and the insertion holes 321 respectively correspond in position to the solder parts 3122 under the second terminal set 312. The second reinforcing plate 32 includes an adhesive layer 322 disposed on a side surface thereof (as shown in FIG. 4).

The first reinforcing plate 22 of the first connection interface 20 and the second reinforcing plate 32 of the second connection interface 30 can be made of metal material or non-metal material (for example, inorganic or organic insulation material), such as glass fiberboard with flame resistant material grade FR4, steel plate, PP, PET, ceramic, and preferably glass fiberboard with grade FR4. Each of the first reinforcing plate 22 and the second reinforcing plate 32 may have a thickness in a range of 0.4 mm to 1.0 mm. The adhesive layers 222 and 322 respectively coated or attached on the first reinforcing plate 22 and the second reinforcing plate 32 may be made of adhesive paper or pressure-sensitive adhesive, such as double-sided adhesive paper, hot-melt adhesive, epoxy resin, polyester resin, acrylic resin, and preferably double-sided adhesive paper. Upon material of the first reinforcing plate 22 and the second reinforcing plate 32, each of the adhesive layers 222 and 322 may have a thickness in a range of 0.005 mm to 0.20 mm, and preferably 50 µm.

In order to assemble the ultra-thin dual-channel flexible circuit bridge connector of the present disclosure, the dual-channel flexible circuit board 10 is cut to form a specific shape and desired length. It should be noted that the dual-channel flexible circuit board 10 have been processed by, for example, inner-layer manufacturing process, copper foil etching process for forming circuits, laminating process, or drilling and plating process for forming plated-though-holes. The first bridge 21 of the first connection interface 20 and the second bridge 31 of the second connection interface 30 are respectively disposed at two opposite sides of the same surface of the dual-channel flexible circuit board 10, and the solder parts 2122 of the first terminal set 212 and the solder parts 3122 of the second terminal set 312 are downwardly and vertically inserted into the thru vias 18 corresponding thereto at two opposite sides of the dual-channel flexible circuit board 10, respectively. The plurality of first sockets 211 and the second sockets 311 are abutted with the same surface of the dual-channel flexible circuit board 10 by bottoms thereof, and the group of the first sockets 211 is spaced apart from the group of the second sockets 311 by a distance in a length direction of the dual-channel flexible circuit board 10, and the first sockets 211 are respectively disposed on left and right sides of the dual-channel flexible circuit board 10, and the second sockets 311 are respectively disposed on left and right sides of the dual-channel flexible circuit board 10. Next, the solder parts 2122 and the solder parts 3122 exposed out of through holes of the dual-channel flexible circuit board 10 are soldered to form electrical connection, so as to effectively prevent the solder structures on the first terminal set 212, the second terminal set 312 and the dual-channel flexible circuit board 10 from being broken or peeled off, thereby making entire structure of the ultra-thin dual-channel flexible circuit bridge connector more stable.

Next, the flux remaining on the soldering areas of the thru vias 18 of the dual-channel flexible circuit board 10 are de-flashed, the dual-channel flexible circuit board 10 is glued on other side surface thereof opposite to the first bridge 21 and the second bridge 31, or release films attached on the adhesive layers 222 and 322 of the first reinforcing plate 22 and the second reinforcing plate 32 are torn off, and the insertion holes 221 and 321 are respectively aligned with the solder parts 2122 of the first terminal set 212 and the solder parts 3122 of the second terminal set 312 exposed out of the back surface of the dual-channel flexible circuit board 10; next, the first reinforcing plate 22 and the second reinforcing plate 32 are respectively pressed down to be combined on the back surface of the dual-channel flexible circuit board 10 by the adhesive layers 222 and 322. the insertion holes 221 of the first reinforcing plate 22 and the insertion holes 321 of the second reinforcing plate 32 may have a diameter larger than that of the solder parts 2122 of the first terminal set 212 and the solder parts 3122 of the second terminal set 312, so that the first reinforcing plate 22 and the second reinforcing plate 32 can be laminated on the back surface of the dual-channel flexible circuit board 10 more stronger without bubbles, thereby ensuring the adhesive effect between the first reinforcing plate 22, the second reinforcing plate 32 and the dual-channel flexible circuit board 10. As a result, assembly of the ultra-thin dual-channel flexible circuit bridge connector of the present disclosure can be completed.

Figure 5:
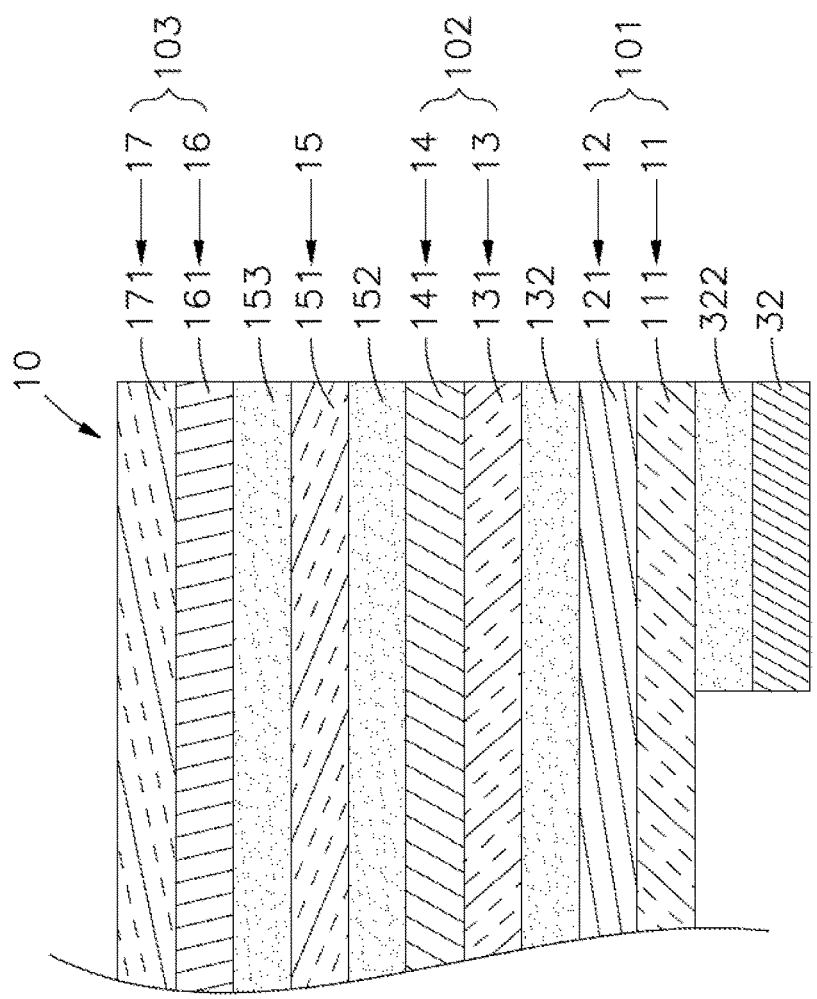
FIG. 5 is a schematic structural view of the dual-channel flexible circuit board of a preferred embodiment of the present disclosure.

The following refers to FIG. 5. The difference between the dual-channel flexible circuit board 10 of the previous embodiment and that of this embodiment shown in FIG. 5 is that there is no first adhesive layer 112 between the first film 111 and the first conductor 121 of the first flexible substrate 101 of this embodiment, and the first conductor 121 of the first circuit layer 12 is directly manufactured on the first film 111 upon different manufacturing process, so as to form a 2-layer FCCL which is then etched to form the desired circuit. However, the actual application of the present disclosure is not limited to this example. In this embodiment, the third adhesive layer 133 between the metal conductor 141 and the second film 131 of the second flexible substrate 102, and the sixth adhesive layer 172 between the fourth film 171 and the second conductor 161 of the third flexible substrate 103 are omitted, and the metal conductor 141 and the second conductor 161 are directly manufactured on the second film 131 and the fourth film 171 respectively to form 2-layer FCCLs. The difference between the 2-Layer FCCL and the 3-Layer FCCL is that, in the 2-Layer FCCL, there is no adhesive layer between inner films and copper foils of the first flexible substrate 101, the second flexible substrate 102 and the third flexible substrate 103, so as to prevent from the inner stress problem and metal thinning problem caused by the adhesive layer, and obtain advantages of higher folding resistance and dimensional stability. Furthermore, when the dual-channel flexible circuit board 10 has fewer layers, the thickness of whole structure of the dual-channel flexible circuit board 10 can be reduced. However, the 2-Layer FCCL has higher cost in manufacturing process, such as coating process, laminating process, or sputtering/plating process; in the other hand, the 3-Layer FCCL is formed by laminating the film and the copper foil through the adhesive layer therebetween, and has an advantage of lower cost than the 2-Layer FCCL. Furthermore, the 3-Layer FCCL can be more suitably manufactured by thicker copper layer. Therefore, the dual-channel flexible circuit board 10 can be manufactured by different processes upon the required thickness and folding resistance of the dual-channel flexible circuit board 10. The following describes the different manufacturing processes.

Figure 6:
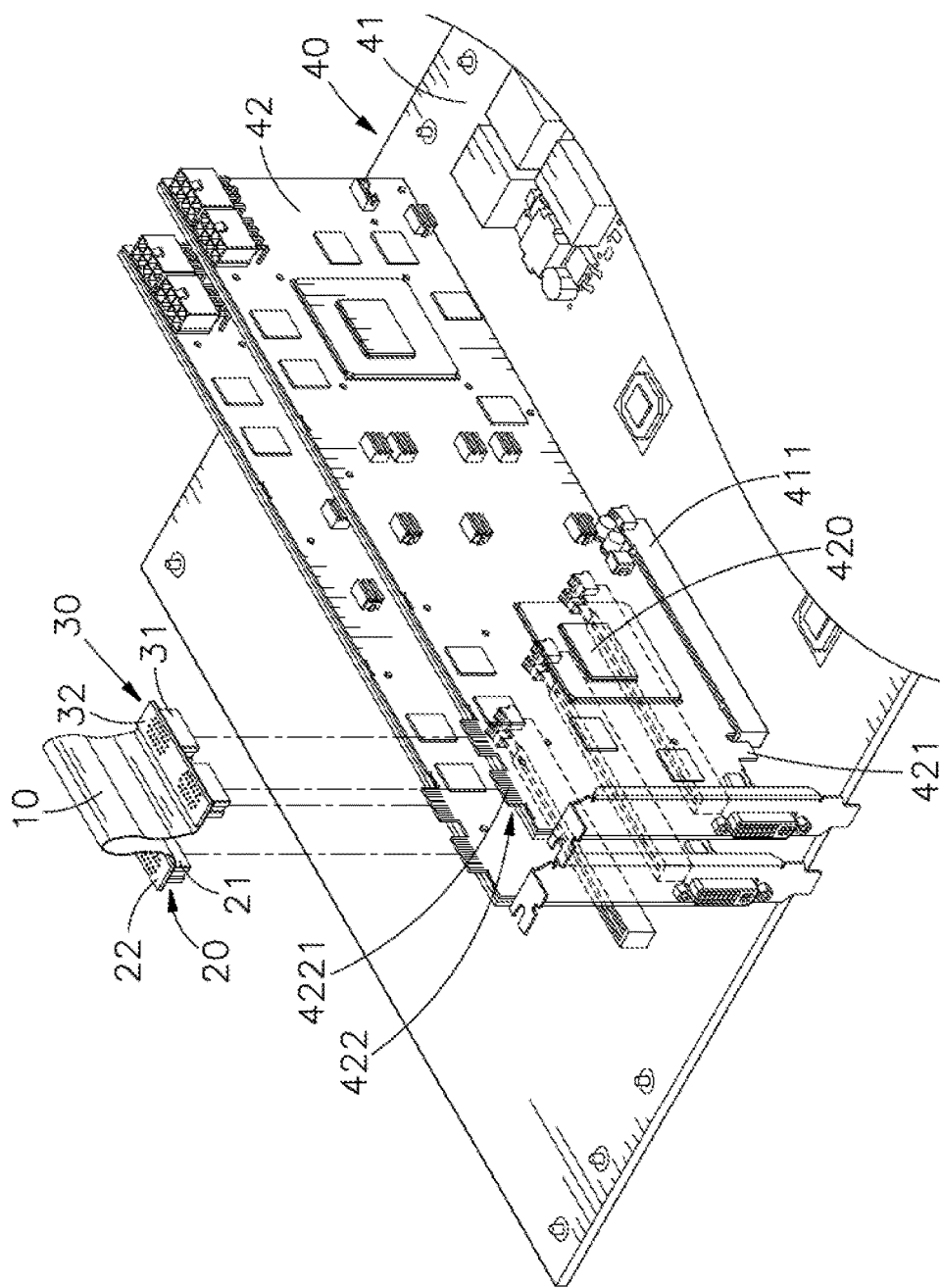
FIG. 6 is an elevational view of other preferred embodiment of the ultra-thin dual-channel flexible circuit bridge connector before connected to other boards, in accordance with the present disclosure.
Figure 7:
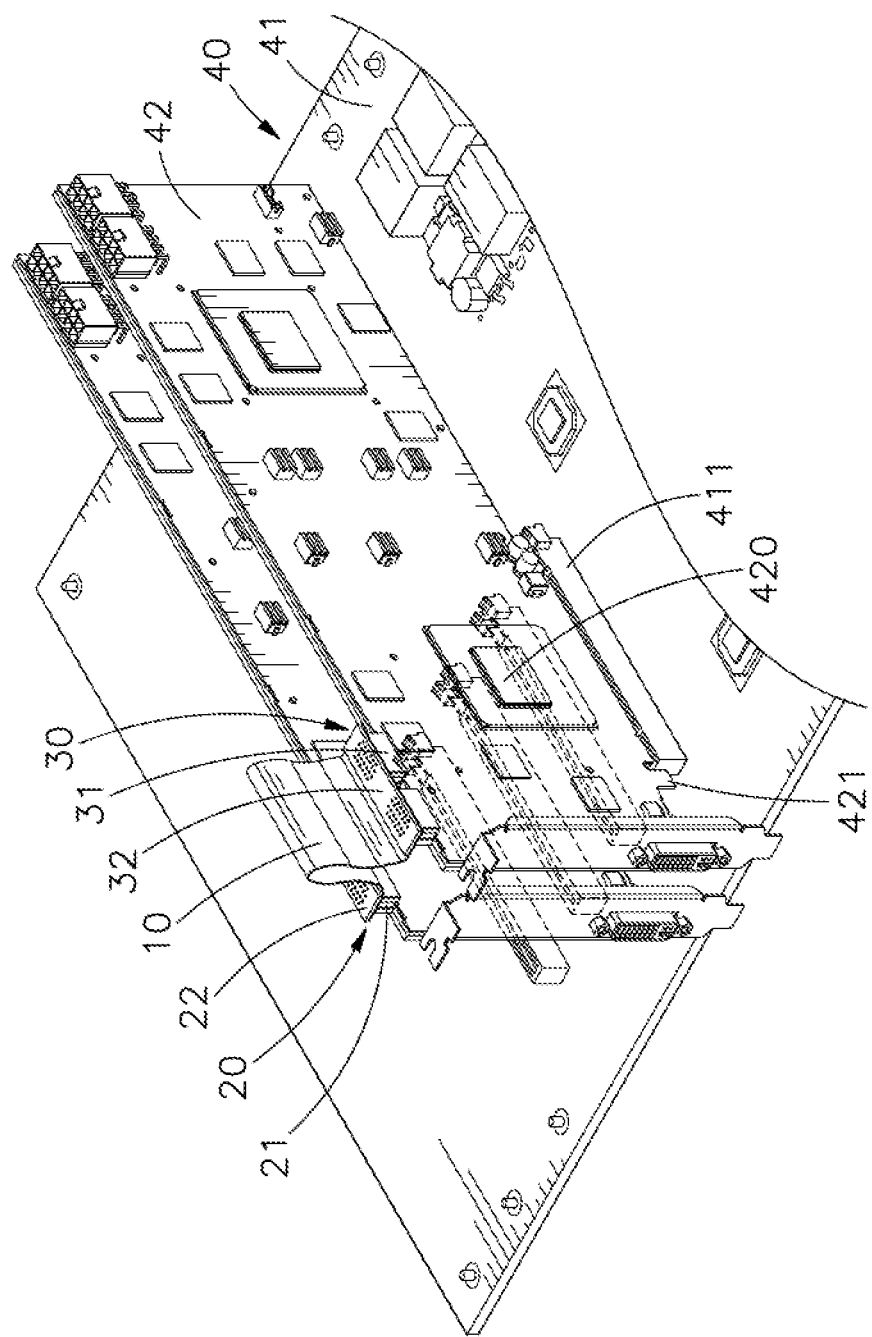
FIG. 7 is an elevational view of the other preferred embodiment of the ultra-thin dual-channel flexible circuit bridge connector after connected to other boards, in accordance with the present disclosure.
Figure 8:
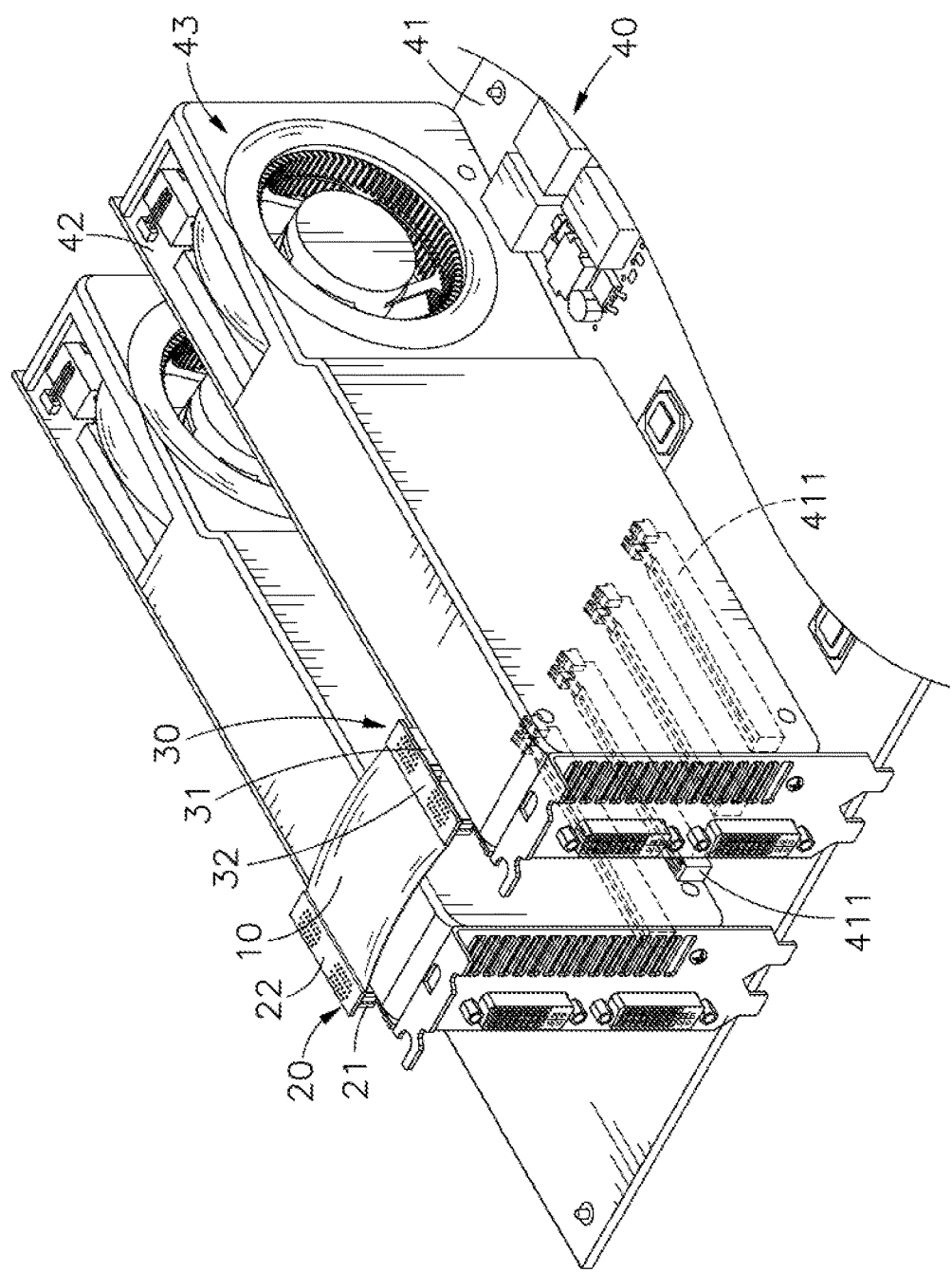
FIG. 8 is an elevational view of another preferred embodiment of the ultra-thin dual-channel flexible circuit bridge connector of the present disclosure.

Please refer to FIGS. 6 through 8, which are elevational view of other preferred embodiment of the ultra-thin dual-channel flexible circuit bridge connector of the present disclosure before connected with other boards, and elevational view after connected with other boards, and elevational view of another preferred embodiment of the ultra-thin dual-channel flexible circuit bridge connector of the present disclosure. The ultra-thin dual-channel flexible circuit bridge connector of the present disclosure can be applied to a system host 40, such as a desktop computer, a personal computer, an industrial computer, a server or a barebone. The system host 40 includes a motherboard 41 which includes a plurality of sockets 411 disposed thereon in parallel. For example, the socket 411 can be PCI Express (PCI-E or PCIe) socket which is based on existing PCI standard, and the at least two sockets 411 are inserted with transmission interfaces 421 of the extend interface cards 42 respectively, for example, the extend interface card 42 may be a graphics card supportable to the scalable link interface (SLI) technology. However, the actual application of the present disclosure is not limited to these examples, for example, the extend interface card can be an extend card for PCI-E to USB/SATA/eSATA/RE-232, or a network card or a sound card with PCI-E interface. The extend interface card 42 can be provided with a chipset 420 including a graphics processing unit (GPU), a network chip, or a sound chip. In this embodiment, the extend interface card 42 is the graphics card supportable to the SLI technology, for illustrative purpose. Each of the extend interface card 42 includes two connectors 422 disposed on a top edge and near a side edge thereof, and spaced apart from each other by a distance. Each of the two connectors 422 includes a plurality of metal contacts 4221 respectively disposed on left and right sides thereof. The motherboard 41 in cooperation with the extend interface cards 42 can execute computation and graphics acceleration for 3D graphics.

In order to link the two extend interface cards 42 on the motherboard 41 by using the ultra-thin dual-channel flexible circuit bridge connector of the present disclosure, the dual-channel flexible circuit board 10 shown in FIG. 1 is turned over by 180 degrees to correspond the first connection interface 20 and the second connection interface 30 in position to the two extend interface cards 42; next, the first bridge 21 is downwardly connected to the connector 422 on the first extend interface card 42 corresponding thereto, to insert the connector 422 into the insert slot 2111 of the first socket 211. The butt joint parts 2121 of the first terminal set 212 are pushed apart subject to the inserting force, so that the connector 422 can be inserted into the insert slot 2111 smoothly. The butt joint parts 2121 of the first terminal set 212 are respectively abutted with and in contact with the plurality of metal contacts 4221 corresponding thereto on the connector 422 to form reliable electrical connection therebetween. By similar way, the second sockets 311 of the second bridge 31 can be respectively connected to the connectors 422 of the second extend interface card 42, and the butt joint part 2121 of the second terminal set 312 can be respectively abutted with and in contact with the plurality of metal contacts 4221 corresponding thereto on the connector 422 to form electrical connection therebetween. As a result, the first connection interface 20, which includes the two first bridges 21, and the second connection interface 30, which includes the two second bridges 31, are respectively connected to the four connectors 422 of the two extend interface cards 42, thereby linking the two extend interface cards 42 in a dual-channel bridge status. In the dual-channel bridge status, the system host 40 is able to use the chipsets 420 on the two extend interface cards 42 to perform parallel computation, so as to improve efficiency of computing process and graphic display.

In this embodiment, under a condition that the first connection interface 20 and the second connection interface 30 of the dual-channel flexible circuit board 10 are used to respectively connect the pair of the first bridges 21 and the pair of the second bridges 31 for linking the two extend interface cards 42 in the bridge status, the first circuit layer 12 and the second circuit layer 16 can be used for high-frequency signal transmission in dual-channel, and the ground layer 14 between the first circuit layer 12 and the second circuit layer 16 is served as the common reference plane for high-frequency signal transmission, so that impedance matching can be formed between the first circuit layer 12, the second circuit layer 16 and the ground layer 14, thereby meeting the requirement of characteristic impedance of 50 ohm (Ω) and reducing power loss of skin effect occurred during high frequency signal reflection and transmission. The ground layer 14 can provide shielding and isolating effect for the first circuit layer 12 and the second circuit layer 16, and disposal of these circuit layers close to the common reference plane can reduce EMI and crosstalk interference occurred during high frequency signal transmission. The conventional single-channel flexible bridge connector has a working bandwidth of only 400 MHz and the conventional dual-channel board bridge connector has a working bandwidth of only 680 MHz, and these conventional bridge connectors are unable to meet the requirement for higher working bandwidth; even if these bridge connectors are redesigned for more signal transmission channels and higher working bandwidth, they may have disadvantages of higher thickness and insufficient flexibility. In the other hand, the dual-channel flexible circuit board 10 of the present disclosure can satisfy the requirement for the working bandwidth up to 1360 MHz, and have a total thickness in a range of 0.2 mm to 0.6 mm for nice compactness, and have higher folding resistance; furthermore, the dual-channel flexible circuit board 10 can improve integrity in high frequency signal transmission and also meet the test requirement for characteristic impedance of 50 ohm, thereby achieving stable dual-channel high frequency signal transmission and higher transmission efficiency.

Furthermore, the dual-channel flexible circuit board 10 of the present disclosure has properties of light weight, higher folding resistance and compactness, so the dual-channel flexible circuit board 10 can be upwardly bent as an arch shape, downwardly bent or folded as an acute-angle shape upon demand, and the dual-channel flexible circuit board 10 can be bent or folded by many times without being broken. The pair of the two first bridges 21 of the first connection interface 20 and the pair of the two second bridges 31 of the first connection interface 20 of the second connection interface 30 can be used to link the two extend interface card 42 spaced apart by different distances. Therefore, the ultra-thin dual-channel flexible circuit bridge connector of the present disclosure can be applicable to different design solutions of the motherboard 41 or the extend interface card 42 manufactured by various manufacturers without being limited by different bridge distances or insertion space, so as to meet user's requirement in upgrade and expansion.

Please refer to FIG. 8. The difference between previous embodiments and this embodiment is that in the system host 40 of this embodiment, the extend interface card 42 includes a cooling device 43 which includes a heat-dissipating module (such as a plurality of heat sinks of a cooler bracket or a heat spreader) attached on a surface of the chipset 420. The heat-dissipating module also includes a fan or a plurality of heat conduction pipes inserted therethrough, and a power wire of the fan can be connected to the extend interface card 42, so that the fan can work in cooperation with the heat-dissipating module to dissipate heat of the chipset 420.

In order to quickly dissipate heat, the extend interface card 42 is usually provided with the cooling device 43, but it may add a size of the extend interface card 42 in width direction and two extend interface cards 42 are not easily to respectively plug into two adjacent sockets 411, and this is the reason that there are usually two empty sockets 411 between the two extend interface cards 42 and two extend interface cards 42 occupy four sockets 411. In this architecture, the pair of two bridges 21 of the first connection interface 20 and the pair of two second bridges 31 of the second connection interface 30 of the dual-channel flexible circuit board 10 can be used to link the two extend interface cards 42. As a result, the ultra-thin dual-channel flexible circuit bridge connector of the present disclosure is applicable to different specifications of the motherboards 41 and the extend interface cards 42, and applicable to the two extend interface cards 42 spaced apart by different distances without using different specifications of dual-channel board bridge, so as to prevent problems of high cost and inconveniently receiving when the different specifications of dual-channel board bridges are not in use. The ultra-thin dual-channel flexible circuit bridge connector of the present disclosure has high practicability and applicability.

In summary, the dual-channel flexible circuit board 10 of the present disclosure includes the first insulating layer 11, the first circuit layer 12, the second insulating layer 13, the ground layer 14, the third insulating layer 15, the second circuit layer 16 and the fourth insulating layer 17, and has a total thickness in a range of 0.2 mm to 0.6 mm for better compactness, and has higher folding resistance; the first connection interface 20 and the second connection interface 30 electrically connected to two opposite sides on the same surface of the dual-channel flexible circuit board 10 can be used to link the two extend interface cards 42 spaced apart by different distances to form the bridge status; the ground layer 14 between the first circuit layer 12 and the second circuit layer 16 can be served as the common reference plane for dual-channel high frequency signal transmission to satisfy the requirement for working bandwidth and characteristic impedance, and disposal of the circuit layers close to the reference plane can reduce EMI during high frequency signal transmission, thereby achieving effect of stable dual-channel high frequency signal transmission and higher transmission efficiency.

The present disclosure disclosed herein has been described by means of specific embodiments. However, numerous modifications, variations and enhancements can be made thereto by those skilled in the art without departing from the spirit and scope of the invention set forth in the claims.

What is claimed is:

1. An ultra-thin dual-channel flexible circuit bridge connector, comprising a dual-channel flexible circuit board, a first connection interface and a second connection interface disposed on two sides of said dual-channel flexible circuit board and electrically connected to each other, wherein:

said dual-channel flexible circuit board comprises, in a sequential order, a first insulating layer, a first circuit layer, a second insulating layer, a ground layer, a third insulating layer, a second circuit layer and a fourth insulating layer, and two opposite sides of said first circuit layer, said ground layer and said second circuit layer are electrically connected to said first connection interface and said second connection interface, respectively;

wherein said ground layer is disposed between said first circuit layer and said second circuit layer and serves as a common reference plane for dual-channel signal transmission, thereby providing impedance matching between said first circuit layer, said second circuit layer and said ground layer.

2. The ultra-thin dual-channel flexible circuit bridge connector according to claim 1, wherein said first insulating layer comprises a first film, said first circuit layer comprises a first conductor, said second insulating layer comprises a second film, and a second adhesive layer disposed on a lower surface of said second film and configured to combine with said first conductor;

wherein said ground layer comprises a metal conductor;

wherein said third insulating layer comprises a third film, a fourth adhesive layer disposed on a lower surface of said third film and configured to combine with said metal conductor, and a fifth adhesive layer disposed on an upper surface of said third film;

wherein said second circuit layer comprises a second conductor, and said fifth adhesive layer configured to combine said second conductor on said third film;

wherein said fourth insulating layer comprises a fourth film;

wherein each of said first film and said fourth film has a thickness in a range of 0.5 mil to 1 mil;

wherein each of said second film and said third film has a thickness in a range of 1 mil to 2 mil;

wherein each of said second adhesive layer and said fifth adhesive layer has a thickness in a range of 15 μm to 25 μm, and said fourth adhesive layer has a thickness in a range of 20 μm to 30 μm, and each of said first conductor, said ground layer and said second conductor has a thickness in a range of 30 μm to 40 μm.

3. The ultra-thin dual-channel flexible circuit bridge connector according to claim 2, wherein the dual-channel flexible circuit board comprises a first flexible substrate, a second flexible substrate and a third flexible substrate, and a first adhesive layer is disposed on an upper surface of said first film, and said first conductor is combined on said first film by said first adhesive layer, and said first flexible substrate is a 3-Layer FCCL formed by said first film, said first adhesive layer and said first conductor;

wherein a third adhesive layer is disposed on an upper surface of said second film, and said metal conductor is combined on said second film by said third adhesive layer, and said second flexible substrate is a 3-Layer FCCL formed by said second film, said third adhesive layer and said metal conductor;

wherein a sixth adhesive layer is disposed on a lower surface of said fourth film, and said fourth film is combined on said second conductor by said sixth adhesive layer, and said third flexible substrate is a 3-Layer FCCL formed by said fourth film, said sixth adhesive layer and said second conductor;

wherein each of said first adhesive layer and said sixth adhesive layer has a thickness in a range of 20 μm to 30 μm, and said third adhesive layer has a thickness in a range of 15 μm to 25 μm.

4. The ultra-thin dual-channel flexible circuit bridge connector according to claim 3, wherein said first adhesive layer, said third adhesive layer and said sixth adhesive layer are made of epoxy resin, polyester resin or acrylic resin.

5. The ultra-thin dual-channel flexible circuit bridge connector according to claim 2, wherein the dual-channel flexible circuit board comprises a first flexible substrate, a second flexible substrate and a third flexible substrate, and said first circuit layer is manufactured on said first film to form said first flexible substrate as 2-Layer FCCL;

wherein said metal conductor is manufactured on said second film to form said second flexible substrate as 2-Layer FCCL, and said second conductor is manufactured on said fourth film to form said third flexible substrate as 2-Layer FCCL.

6. The ultra-thin dual-channel flexible circuit bridge connector according to claim 2, wherein said first film, said second film, said third film and said fourth film are made of PI or PET.

7. The ultra-thin dual-channel flexible circuit bridge connector according to claim 2, wherein said second adhesive layer, said fourth adhesive layer and said fifth adhesive layer are made of epoxy resin, polyester resin or acrylic resin.

8. The ultra-thin dual-channel flexible circuit bridge connector according to claim 2, wherein each of said first conductor and said second conductor are made of rolled copper foil or electrolytic copper foil, and etched to form circuits.

9. The ultra-thin dual-channel flexible circuit bridge connector according to claim 2, wherein said metal conductor is made of copper, aluminum or silver.

10. The ultra-thin dual-channel flexible circuit bridge connector according to claim 1, wherein said dual-channel flexible circuit board has a thickness in a range of 0.2 mm to 0.6 mm.

* * * * *